United States Patent
Tezuka

(10) Patent No.: US 10,026,776 B2
(45) Date of Patent: Jul. 17, 2018

(54) METHOD FOR MANUFACTURING SOLID STATE IMAGE PICKUP APPARATUS

(71) Applicant: CANON KABUSHIKI KAISHA, Tokyo (JP)

(72) Inventor: Tomoyuki Tezuka, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/628,496

(22) Filed: Jun. 20, 2017

(65) Prior Publication Data

US 2018/0006082 A1    Jan. 4, 2018

(30) Foreign Application Priority Data

Jun. 30, 2016  (JP) .................................. 2016-130907

(51) Int. Cl.
*H01L 27/146*  (2006.01)

(52) U.S. Cl.
CPC .. *H01L 27/14689* (2013.01); *H01L 27/14687* (2013.01)

(58) Field of Classification Search
CPC .................. H01L 27/14689; H01L 27/14687
See application file for complete search history.

(56) References Cited

U.S. PATENT DOCUMENTS

| | | | | |
|---|---|---|---|---|
| 2006/0043439 A1* | 3/2006 | Koizumi | ........... | H01L 27/14601 257/291 |
| 2006/0290659 A1* | 12/2006 | Sakano | ............. | H01L 27/14687 345/156 |
| 2010/0330723 A1* | 12/2010 | Okabe | ............... | H01L 21/28518 438/59 |
| 2015/0333098 A1* | 11/2015 | Endo | ................... | H01L 31/0264 257/187 |

FOREIGN PATENT DOCUMENTS

JP        2001-111022 A        4/2001

* cited by examiner

Primary Examiner — Karen Kusumakar
(74) Attorney, Agent, or Firm — Canon U.S.A., Inc. IP Division

(57) ABSTRACT

A method for manufacturing a solid state image pickup apparatus, including the steps of forming, by removing part of an insulating layer by using a first mask, a first contact opening on an impurity region, and a second contact opening over a compound layer such that a first portion, which covers the compound layer, of the insulating layer is exposed at a bottom of the second contact opening, and ion-implanting an impurity into the impurity region through the first contact opening while the first portion covering the compound layer is exposed at the second contact opening, wherein the impurity region is disposed in a pixel region including a photoelectric conversion unit, and the compound layer is disposed on at least one of a gate electrode, a drain region, and a source region of a transistor disposed in a peripheral circuit region and is composed of a metal and a semiconductor.

21 Claims, 8 Drawing Sheets

METHOD FOR MANUFACTURING SOLID STATE IMAGE PICKUP APPARATUS

BACKGROUND

Field of the Disclosure

The present disclosure relates to a method for manufacturing a solid state image pickup apparatus.

Description of the Related Art

Methods for manufacturing a solid state image pickup apparatus in the related art include a manufacturing method described in Japanese Patent Laid-Open No. 2001-111022. The solid state image pickup apparatus according to Japanese Patent Laid-Open No. 2001-111022 includes a photoelectric conversion unit and a peripheral circuit unit in the same semiconductor substrate. A diffusion layer that functions as a light receiving portion is disposed in the photoelectric conversion unit. An MOS transistor constituting a peripheral circuit that processes signals is disposed in the peripheral circuit unit. A refractory metal semiconductor compound layer is disposed on a source region, a drain region, and a gate electrode and, thereby, high-speed operation of even a micro-transistor is performed. Meanwhile, a refractory metal semiconductor compound layer is not disposed on the upper surface of the diffusion layer of the photoelectric conversion unit and the diffusion layer is protected by an insulating layer so as to suppress a leakage current of the photoelectric conversion unit.

SUMMARY

The present disclosure provides a method for manufacturing a solid state image pickup apparatus, including the steps of forming, by removing part of an insulating layer by using a first mask, a first contact opening on an impurity region, and a second contact opening over a compound layer such that a first portion, which covers the compound layer, of the insulating layer is exposed at a bottom of the second contact opening, and ion-implanting an impurity into the impurity region through the first contact opening while the first portion that covers the compound layer is exposed at the second contact opening, wherein the impurity region is disposed in a pixel region including a photoelectric conversion unit, and the compound layer is disposed on at least one of a gate electrode, a drain region, and a source region of a transistor disposed in a peripheral circuit region and is composed of a metal and a semiconductor.

Further features of the present disclosure will become apparent from the following description of exemplary embodiments with reference to the attached drawings.

DESCRIPTION OF THE EMBODIMENTS

Figure 1A:
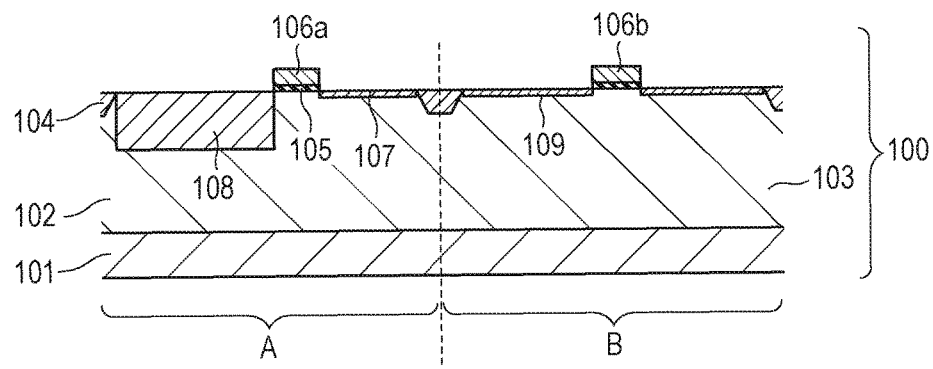
FIGS. 1A to 1C are sectional views illustrating a method for manufacturing a solid state image pickup apparatus according to one embodiment.

The present inventors found that the contact resistance between a semiconductor region and a metal in a pixel region was reduced by introducing a high-concentration impurity layer into a contact bottom portion.

According to Japanese Patent Laid-Open No. 2001-111022, in a peripheral circuit region, at a contact portion between a semiconductor region and a metal, a compound composed of the metal and the semiconductor is formed. Therefore, in the case where contact openings are located in a pixel region and the peripheral circuit region at the same time, the metal may scatter into the contact openings in the pixel region.

That is, when a high-concentration impurity is implanted after a contact opening is formed in the pixel region, the impurity is also implanted into the contact opening in the peripheral circuit region because the contact opening is also located in the peripheral circuit region. At this time, a compound composed of the metal and the semiconductor may scatter in the contact bottom portion due to the impurity implanted. In the case where the compound or the metal constituting the compound scatters into the contact opening in the pixel region, it is considered that the metal is introduced into the semiconductor in the pixel region. The introduced metal may cause, for example, an increase in leakage current of the photoelectric conversion unit. As described above, noise may be caused by the metal introduced into the pixel region.

A method for manufacturing a solid state image pickup apparatus according to an embodiment will be described below with reference to the drawings. Examples of embodiments will be described below but the present disclosure is not limited to these. Partial modifications may be made within the bounds of not departing from the gist of the present disclosure.

Each drawing is described for the purpose of illustrating the structure or the configuration. The dimensions of each member shown in the drawing may be different from the dimensions of an actually constructed element. In the drawings, the same members or the same constructional elements are indicated by the same reference numerals and explanations thereof are not repeated hereafter.

In the present specification, "a member A is disposed or formed on a member B" refers to a configuration in which at least part of the member B is overlapped by the member A in the height direction, unless otherwise specified. The height direction in the present specification is a direction perpendicular to the interface between a semiconductor region in the photoelectric conversion unit and an insulating layer formed thereon.

One Embodiment

A method for manufacturing a solid state image pickup apparatus according to the present embodiment will be described with reference to FIGS. 1A to 1C, FIGS. 2A to 2C, FIGS. 3A to 3C, and FIG. 4. In the solid state image pickup apparatus, a pixel region A including a photoelectric conversion unit 108 and a first impurity region 107 and a peripheral circuit region B including a transistor of a peripheral circuit that covers signals based on the charge generated in the photoelectric conversion unit 108 are disposed. The transistor constituting the peripheral circuit includes a compound layer composed of a metal and a semiconductor disposed on at least one of a gate electrode, a drain region, and a source region.

In the present embodiment, for the sake of simplification, only the photoelectric conversion unit 108, a transfer transistor, and the first impurity region 107 that is a floating diffusion region, to which the charge generated in the photoelectric conversion unit 108 is transferred by the transfer transistor, are shown in the pixel region A. Also, in the peripheral circuit region, only one transistor of the peripheral circuit is shown. However, the pixel region A may include a plurality of pixels, and each pixel may appropriately have the photoelectric conversion unit 108, the transfer transistor, and in addition to the photoelectric conversion unit 108, a reset transistor, an amplification transistor, a selection transistor, and the like.

The peripheral circuit is composed of a plurality of transistors. The plurality of transistors may include an NMOS transistor and a PMOS transistor. For the purpose of improving contact with the wiring, the transistor in the peripheral circuit region B includes a compound layer composed of a metal and a semiconductor on an impurity region serving as a source region or a drain region. Also, the transistor in the peripheral circuit region B has a compound layer composed of a metal and a semiconductor on the gate electrode. In the transistor according to the present embodiment, the compound layer composed of a metal and a semiconductor is disposed on each of the source region, drain region, and the gate electrode. However, the compound layer composed of a metal and a semiconductor has to be disposed on at least one of the source region, the drain region, and the gate electrode. The photoelectric conversion unit and the impurity region in the pixel region and the impurity region in the peripheral circuit region may be disposed in the same semiconductor substrate and be formed by a process technology used for producing a semiconductor device.

In FIG. 1A, a pixel region well 102 and a peripheral circuit region well 103 are formed by implanting an impurity into a silicon substrate 101 and performing annealing. Element isolation portions 104 are disposed between pixels in the pixel region A and between the pixel region A and the peripheral circuit region B. The element isolation portion 104 may be formed by, for example, a shallow trench isolation (STI) method or LOCOS (local oxidation of silicon).

An insulating film 105 serving as a gate insulating film of each transistor is formed so as to cover the pixel region well 102 and the peripheral circuit region well 103. After the insulating film 105 is formed, a gate electrode 106a of the transfer transistor and a gate electrode 106b of the transistor of the peripheral circuit are formed by, for example, formation of a polysilicon film, photolithography, and anisotropic etching. Here, the gate electrodes 106a and 106b are formed by using polysilicon.

After the gate electrodes 106a and 106b are formed, an impurity is implanted into a semiconductor substrate 100. Consequently, the first impurity region 107 that serves as the floating diffusion region and the photoelectric conversion unit 108 in the pixel region A and a second impurity region 109 that serves as an LDD region of the transistor in the peripheral circuit region B are formed. In the case where the charge of the photoelectric conversion unit 108 is based on electrons, the photoelectric conversion unit 108 includes at least an N-type impurity region (third impurity region). The impurity to be implanted is, for example, phosphorus or arsenic which is an impurity that makes a region implanted with the impurity into an N-type semiconductor region.

In the present embodiment, the case where electrons are used as signal carriers will be described. In the case where holes are used as signal carriers, a P-type semiconductor region is changed to an N-type semiconductor region, and an N-type semiconductor region is changed to a P-type semiconductor region.

Here, the gate electrodes 106a and 106b have sufficiently large thickness regarding the impurity implantation, and a flow, in which self alignment implantation is performed after the gate electrodes 106a and 106b are formed, is shown. However, the present embodiment is not limited to this. For example, the impurity implantation for forming the first impurity region 107, the second impurity region 109, and the photoelectric conversion unit 108 may be performed before the gate electrodes 106a and 106b are formed.

Figure 1B:
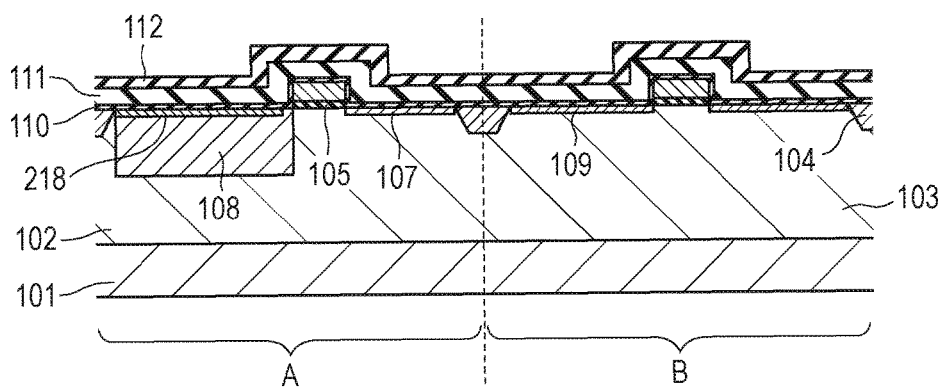

As shown in FIG. 1B, in the pixel region A, a high-concentration impurity is implanted into the vicinity of the surface of the photoelectric conversion unit 108 so as to form a fourth impurity region 218. The fourth impurity region 218 is a P-type semiconductor region. In this manner, the first impurity region 107, the second impurity region 109, the photoelectric conversion unit 108, and the fourth impurity region 218 are formed in the semiconductor substrate 100.

After the fourth impurity region 218 is formed, an insulating film 110, an insulating film 111, and an insulating film 112 that cover the photoelectric conversion unit 108, the gate electrodes 106a and 106b, the first impurity region 107, and the second impurity region 109 are formed in the pixel region A and the peripheral circuit region B. The insulating films 110 and 112 are formed by using a material such as silicon oxide having a small refractive index, and the insulating film 111 is formed by using a material such as silicon nitride having a large refractive index. The insulating films 110, 111, and 112 function as pixel portion antireflection layers because of their above-described structures.

The composition of the insulating films 110 and 112 is different from the composition of the insulating film 111, and the refractive index of the insulating film 111 is larger than the refractive index of the insulating films 110 and 112. The composition of a member A refers to elements constituting the member A and ratios thereof.

The insulating films 110, 111, and 112 function as protective films that prevent metal atoms attributed to the scattered compound of a metal and a semiconductor from diffusing into the semiconductor substrate in the pixel region A, as described later. The film thicknesses of the insulating films 110, 111, and 112 are about 100 Å, about 500 Å, and about 200 to 600 Å, respectively. The film thickness of the insulating film 112 is adjusted in accordance with the width of a side spacer, described later, formed in the peripheral circuit region B.

Figure 1C:
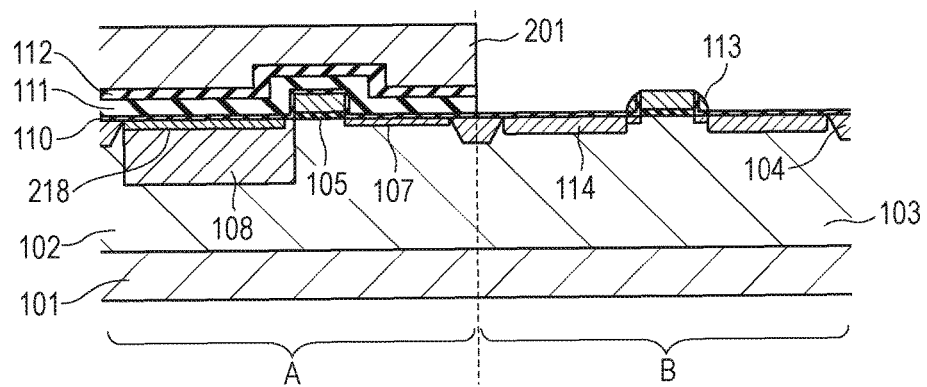

As shown in FIG. 1C, the insulating films 110, 111, and 112 in the peripheral circuit region B are removed by using a mask that covers the pixel region A. Specifically, a photoresist film that covers the pixel region A and that exposes the peripheral circuit region B is formed by photolithography and, thereafter, the insulating films 110, 111, and 112 in the peripheral circuit region B are removed by etching while the photoresist film is used as a mask. At this time, a side spacer 113 that covers the side surface of the gate electrode 106b of the transistor of the peripheral circuit is formed. For example, dry etching may be used as the etching.

A fifth impurity region 114 serving as a source-drain region of the transistor of the peripheral circuit is formed by using the side spacer 113 as a mask and performing self-alignment implantation of an impurity into the peripheral circuit region B of the semiconductor substrate. In this regard, the impurity to be implanted is an impurity that makes a region implanted with the impurity into an N-type semiconductor region.

Consequently, as shown in FIG. 1C, the source-domain region of the transistor of the peripheral circuit has a structure in which the fifth impurity region 114 and the LDD region are included. The LDD region and the fifth impurity region 114 have the same conductivity type. The impurity concentration of the LDD region is lower than the impurity concentration of the fifth impurity region 114. In this regard, the pixel region A is provided with the mask 201 and, therefore, the impurity concentrations of the source region and the drain region of the transistor in the pixel region are at the same level as the impurity concentration of the LDD region 109 of the transistor of the peripheral circuit.

After the fifth impurity region 114 is formed, the mask 201 is removed, and another insulating film, although not shown in the drawing, may be formed on the entire surface in the pixel region A and the peripheral circuit region B by a CVD method or PVD method that uses, for example, silicon oxide. Thereafter, a photoresist film is used as a mask, the another insulating film is removed from the peripheral circuit region B and is left only in the pixel region A.

Figure 2A:
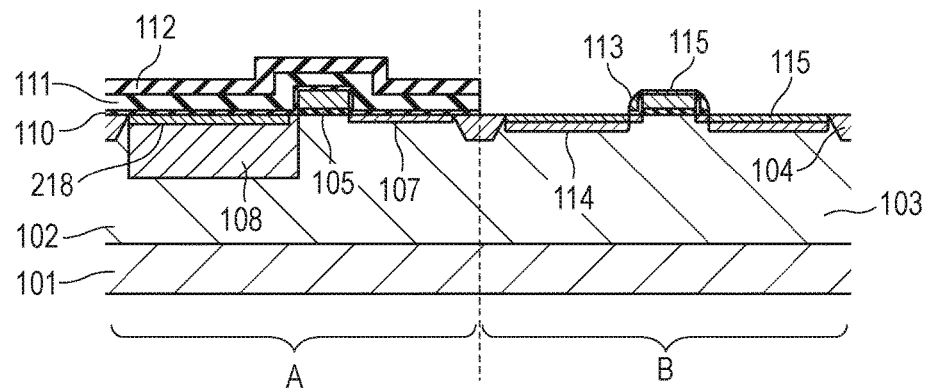
FIGS. 2A to 2C are sectional views illustrating the method for manufacturing a solid state image pickup apparatus according to one embodiment.

A compound layer 115 composed of a metal and a semiconductor (metal silicide layer) is formed on surface portions of the gate electrode 106b and the fifth impurity region 114 in the peripheral circuit region B by a salicide (Self-ALIgned siliCIDE) process (FIG. 2A). Specifically, the compound layer 115 composed of a metal and a semiconductor may be formed by forming a metal film that covers the insulating film 112 in the pixel region A and the fifth impurity region 114, the gate electrode 106b, and the spacer 113 in the peripheral circuit region B and performing annealing. Thereafter, an unreacted metal film is removed.

In this manner, the compound layer 115 composed of a metal and a semiconductor is formed on the semiconductor substrate. A metal nitride film may be formed as an antioxidant film on the metal film. A layered structure of, for example, cobalt and titanium nitride may be formed as the metal film and the antioxidant film.

The compound layer 115 composed of a metal and a semiconductor contains any one of silicides of titanium, nickel, cobalt, tungsten, molybdenum, tantalum, chromium, palladium, and platinum and silicides of alloys of these metals. For example, the compound layer 115 composed of a metal and a semiconductor is at least one selected from the group consisting of titanium silicide, nickel silicide, cobalt silicide, tungsten silicide, molybdenum silicide, tantalum silicide, chromium silicide, palladium silicide, and platinum silicide.

When the compound layer 115 composed of a metal and a semiconductor is formed, in the pixel region A, the semiconductor substrate and the gate electrode 106a are covered with a protective film composed of the insulating films 110, 111, and 112 and do not come into contact with the metal. Therefore, the above-described compound layer is not formed on the gate electrode 106a, the first impurity region 107, and the like in the pixel region A. The thickness of the protective film is designed in consideration of diffusion of the metal in accordance with the annealing time, the annealing temperature, and the like. Diffusion of the metal is further reduced by increasing the thickness of the protective film, but it is not always necessary to completely prevent diffusion.

Figure 2B:
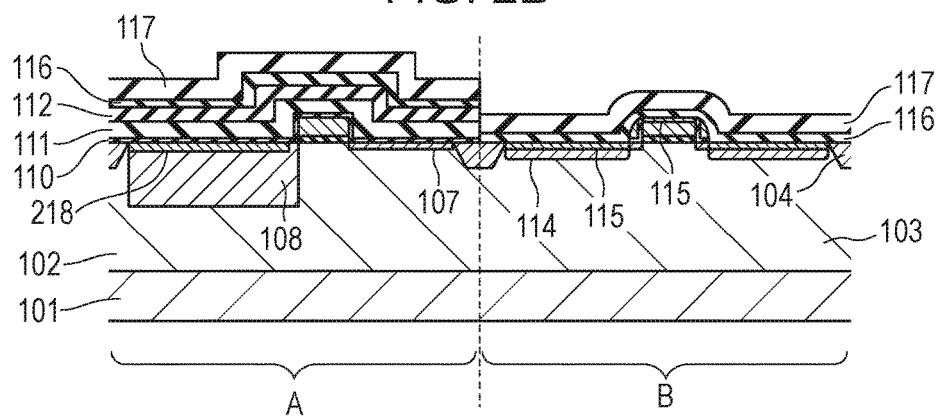

As shown in FIG. 2B, after the compound layer 115 composed of a metal and a semiconductor is formed, for example, an oxide film and a nitride film serving as an insulating film 116 and an insulating film 117, respectively, are formed on the entire surface in the pixel region A and the peripheral circuit region B by using, for example, a sputtering method or a CVD method. The insulating film 117 is set to be a film having a composition different from the composition of the insulating film 116. The insulating film 116 can have the same composition as the composition of the insulating films 110 and 112. Therefore, for example, the insulating film 116 may be formed by silicon oxide, and the insulating film 117 may be formed by using silicon nitride.

Figure 2C:
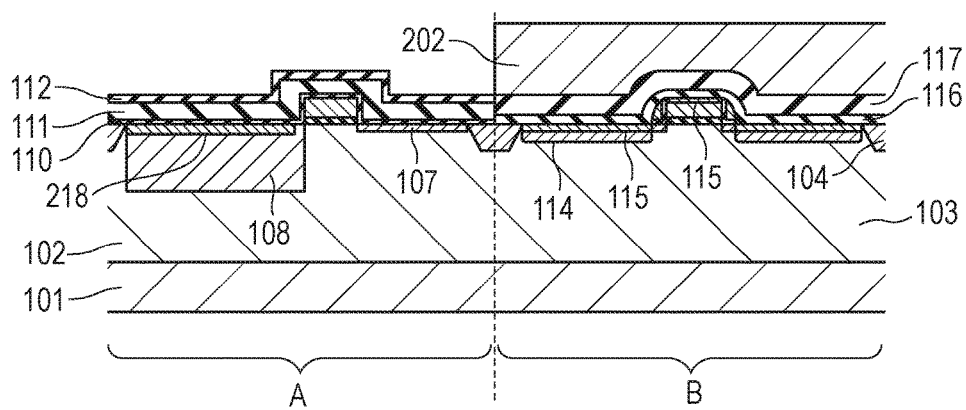

A photoresist film that covers the peripheral circuit region B and that exposes the pixel region A is formed by photolithography. Thereafter, the resulting photoresist film is used as a mask 202, and the insulating films 116 and 117 in the pixel region A are removed by etching. At, this time, the insulating film 116 may be incompletely removed such that only the film thickness is decreased (FIG. 2C). Subsequently, the mask 202 is removed by asking or the like.

The film thickness of the insulating film 116 can be larger than the film thickness of the insulating film 110. Specifically, the film thickness of the insulating film 116 may be about 300 Å. The film thickness of the insulating film 117 may be, for example, about 500 Å that is the same as the film thickness of the insulating film 111. The film thickness of each insulating film is a length, above the photoelectric conversion unit 108, in a direction perpendicular to the interface between the photoelectric conversion unit 108 (or fourth impurity region 218) and the insulating film formed thereon.

Figure 3A:
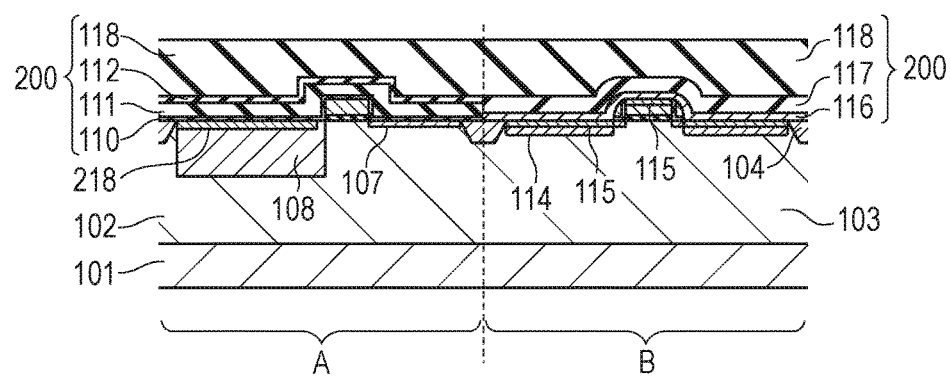
FIGS. 3A to 3C are sectional views illustrating the method for manufacturing a solid state image pickup apparatus according to one embodiment.

After the insulating films 116 and 117 are removed from the pixel region A, an insulating film 118 is formed as an interlayer film on the insulating films 110, 111, and 112 in the pixel region A and the insulating films 116 and 117 in the peripheral circuit region B (FIG. 3A). The insulating film 118 can be formed so as to have a composition different from the compositions of the insulating film 111 and the insulating film 117. For example, the insulating film 118 may be formed as a silicon oxide film or a silicon oxide film containing boron or phosphorus. The insulating films 110, 111, 112, 116, 117, and 118 are collectively referred to as an insulating layer 200.

Figure 3B:
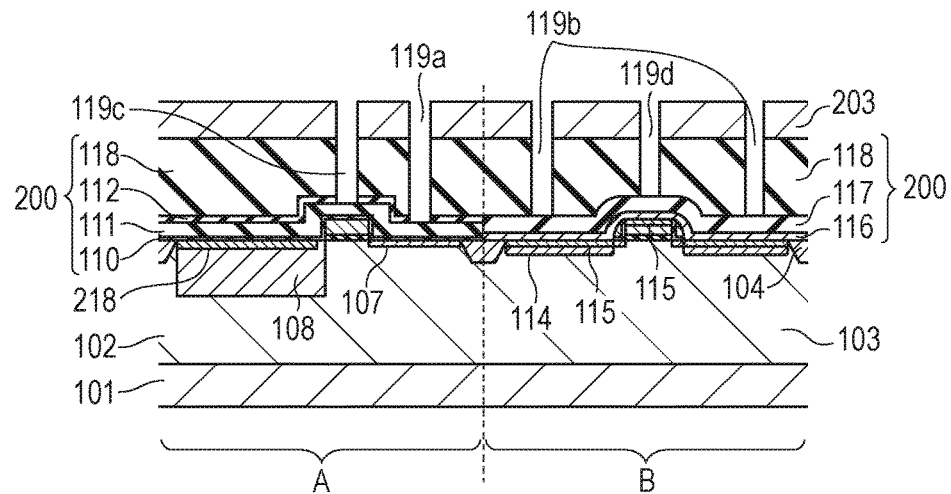

As shown in FIG. 3B, contact openings 119 are formed in the insulating layer. Specifically, a photoresist film that covers a portion other than the first impurity region 107 and the gate electrode 106a in the pixel region A and the compound layer 115 in the peripheral circuit region B is formed by photolithography. The resulting photoresist film exposes the first impurity region 107 and the gate electrode 106a in the pixel region A and the compound layer 115 in the peripheral circuit region B. The contact openings 119 are formed by subjecting the insulating film 118 to anisotropic etching that uses the photoresist film as a mask 203.

Regarding the contact openings 119, when explanations common to all the contact openings formed over the first impurity region 107 and the gate electrode 106a in the pixel region A and over the compound layer 115 in the peripheral circuit region B are made, the term "contact openings 119" is used. Meanwhile, when individual contact openings are explained, terms such as "contact openings 119a to 119d" with a letter of the alphabet after the number are used.

Specifically, the contact opening over the first impurity region 107 is specified as a contact opening 119a, and the contact opening over the compound layer 115 on the fifth impurity region 114 is specified as a contact opening 119b. The contact opening over the gate electrode 106a of the transfer transistor in the pixel region A is specified as a contact opening 119c, and the contact opening over the gate electrode 106b of the transistor in the peripheral circuit region B is specified as a contact opening 119d.

In this regard, the contact opening refers to an opening that is to be used for forming a conductive member (hereafter referred to as a contact, a contact plug, or a via plug) to be connected to an impurity region or a compound layer composed of a metal and a semiconductor. In the present exemplary embodiment, the contact openings 119 include the openings located in the mask 203 and the openings located in the insulating film 118 of the insulating layer 200. It is not necessary that the inside of each of the contact openings 119 be entirely filled with the contact.

For example, the mask 203 is removed in the downstream step and, therefore, the contact is not formed inside the openings in the mask 203. However, the openings in the mask 203 are contact openings used for forming the contacts because the mask 203 is used for etching the insulating film 118 and for ion implantation described later.

In the present embodiment, both the insulating film 112 and the insulating film 118 are formed by using silicon oxide and, therefore, the insulating film 112 is also etched following the insulating film 118 in the pixel region A during etching of the insulating film 118.

The insulating film 111 functions as an etch stop layer during formation of the contact opening 119a and the contact opening 119c, and the insulating film 117 functions as an etch stop layer during formation of the contact opening 119b and the contact opening 119d. The composition of the insulating film 111 and the insulating film 117 is different from the composition of the insulating film 118 and the insulating film 112. An etchant having a sufficient etching selectivity ratio of the insulating films 111 and 117 to the insulating film 118 is used for the etching for forming the contact openings 119a to 119d. In the case where the etching is performed under such a condition, the insulating film 111 and the insulating film 117 function as the etch stop layers.

The depth of each of the contact openings (the length in the height direction from the surface of the insulating film 118 to the bottom of the contact opening) differs with the location of formation. However, in the case where the insulating films 111 and 117 serve as the etch stop layers, each of the contact openings is formed in the same etching step without over etching.

Figure 3C:
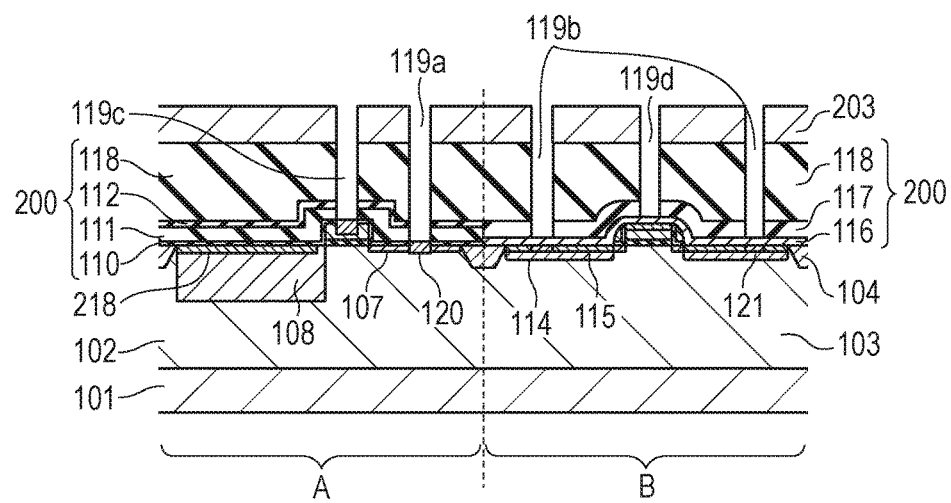

Subsequently, the mask 203 shown in FIG. 3C is used, and the insulating film 111 and the insulating film 117 are etched so as to extend the contact openings 119a to 119d downward. Regarding the mask used for the etching, the same mask as that used in the etching of the insulating film 118 and the insulating film 112 may be used. At this time, an etchant that allows the insulating film 110 to function as an etch stopper of etching of the insulating film 111 and allows the insulating film 116 as an etch stopper of etching of the insulating film 117 is used. Some portions on the sides in contact with the insulating films 111 and the 117 of the insulating films 110 and 116, respectively, may be etched at rates lower than the etching rates of the insulating films 111 and 117, respectively, in accordance with the etchant.

Consequently, in the peripheral circuit region B, the contact opening 119b is formed over the compound layer 115 composed of a metal and a semiconductor with part of the insulating film 116 (first portion of the insulating layer) interposed therebetween. In the pixel region A, the contact opening 119a is formed over the first impurity region 107 such that part of the insulating film 110 (second portion of the insulating layer) is exposed at a bottom of the contact opening 119a.

In this state, impurity ion implantation is performed for the purpose of reducing the contact resistance between a conductor formed in the contact opening and the region connected to the conductor. In particular, for the purpose of reducing the contact resistance between the first impurity region 107 and the conductor, an impurity that makes a region implanted with the impurity into an N-type semiconductor region is implanted as the impurity here. Specifically, the first impurity region 107, the gate electrode 106a, and the compound layer 115 composed of a metal and a semiconductor are subjected to self-alignment impurity implantation by using the contact openings 119a to 119d.

At this time, as shown in FIG. 3C, the impurity is implanted into the first impurity region 107 through the contact opening 119a while part of the insulating film 110 is exposed at a bottom of the contact opening 119a so as to form a high-concentration impurity region 120. Also, the impurity is ion-implanted into the compound layer 115 composed of a metal and a semiconductor through the contact opening 119b while part of the insulating film 116 (first portion of the insulating layer 200) is exposed at a bottom of the contact opening 119b so as to form an impurity-implanted region 121. That is, the impurity is ion-implanted into the first impurity region 107 through the contact opening 119a while the first portion of the insulating layer 200 that covers the compound layer 115 is exposed at the contact opening 119b.

Likewise, the impurity is ion-implanted into the gate electrode 106a through the contact opening 119c and part of the insulating film 110 and into the gate electrode 106b through the contact opening 119d and part of the insulating film 116.

If the impurity is implanted in the state in which the insulating film 116 is not present at the bottom of the contact opening 119b and the compound layer 115 is exposed, part of the compound layer 115 may be scattered due to the impurity implanted. If metal atoms attributed to the scattered compound layer 115 diffuse into the semiconductor substrate in the pixel region A through the contact openings 119a, 119c, and the like in the pixel region A, a leakage current may be generated in the photoelectric conversion unit.

In the method for manufacturing a solid state image pickup apparatus according to the present embodiment, when the impurity is implanted into the first impurity region 107, the compound layer 115 composed of a metal and a semiconductor is covered with at least part of the insulating layer 200 in the contact openings 119b and 119d in the peripheral circuit region B. Specifically, the compound layer 115 composed of a metal and a semiconductor is covered with part of the insulating film 116. Therefore, scattering of the metal atoms attributed to the compound layer 115 composed of a metal and a semiconductor and the resulting diffusion of metal atoms into the semiconductor substrate in the pixel region A are reduced or prevented.

Even in the case where the thickness of the insulating film 116 disposed at the bottoms of the contact openings 119b and 119d in the peripheral circuit region B is as small as the thickness of about one atomic layer, scattering of metal atoms is reduced compared with the case where the compound layer 115 is exposed. It is expected that the effect of preventing scattering of metal atoms is enhanced as the film thickness of the first portion of the insulating film 116 disposed at the bottoms of the contact openings 119b and 119d in the peripheral circuit region B increases. Therefore, the film thickness of the first portion of the insulating film 116 disposed at the bottoms of the contact openings 119b and 119d in the peripheral circuit region B can be large to the extent that scattering of metal atoms is sufficiently reduced.

The film thickness of the insulating film 110 disposed at the bottoms of the contact openings 119a and 119c in the pixel region A can be such a film thickness that allows implantation of the impurity in an amount sufficient for reducing the contact resistance to a predetermined value into the first impurity region 107 and the gate electrode 106a. Therefore, the film thickness of part (first portion) of the insulating film 116 at the bottom of the contact opening 119b can be larger than the film thickness of the insulating film 110 (second portion) at the bottom of the contact opening 119a. In the case where the first portion and the second portion of the insulating layer have the above-described relationship, scattering of the metal atoms attributed to the compound layer 115 composed of a metal and a semiconductor is reduced and, in addition, the contact resistance in the pixel region A is reduced. Also, speedup of the peripheral circuit is enhanced because the compound composed of a metal and a semiconductor may be used for connection between the transistor and the wiring in the peripheral circuit region B.

In the case where the energy used for ion implantation is increased, the impurity is implanted into the first impurity region 107 and the gate electrode 106a regardless of the thickness of the insulating film 110 disposed at the bottom of the contact openings 119a and 119c in the pixel region A. Consequently, the etching of the insulating film 118 performed in the step shown in FIG. 3B may be performed after the ion implantation. That is, the ion implantation may be performed in the state in which the contact openings 119 are located in only the mask 203. At this time, regarding the contact openings 119b and 119d in the peripheral circuit region B, the compound layer 115 is covered with the insulating films 116, 117, and 118. Therefore, in this case, scattering of metal atoms and diffusion of metal atoms into the semiconductor substrate in the pixel region A are reduced or prevented.

In the method for manufacturing a solid state image pickup apparatus according to the present embodiment, the same mask may be used in the step of etching the insulating film 118 and the insulating film 112 and the step of etching the insulating film 111 and the insulating film 117. That is, the contact opening 119a and the contact opening 119b may be formed by using the same mask. Therefore, the step of photolithography and the like are omitted and, thereby, the production cost of the solid state image pickup apparatus is reduced.

After the insulating films 111 and 117 are etched, the insulating film 110 at the bottom of the contact opening 119a in the pixel region A may be removed by about 100 Å of over etching of the insulating film 116. At this time, about 200 Å of insulating film 116 is left at the bottom of the contact opening 119b in the peripheral circuit region B.

In this case, in the pixel region A, the contact opening 119a is located on the first impurity region 107 so as to expose part of the first impurity region 107 at the bottom of the contact opening 119a. In the peripheral circuit region B, the contact opening 119b is located over the compound layer 115 composed of a metal and a semiconductor with part (first portion) of the insulating film 116 therebetween.

In the case where impurity ion implantation is performed in this state for the purpose of reducing the contact resistance, the impurity is implanted into the first impurity region 107 through the contact opening 119a so as to form the high-concentration impurity region 120. Other portions are the same as those in the above-described case and, therefore, explanations will not be provided.

In this method as well, regarding the contact opening 119b and the contact opening 119d, the compound layer 115 composed of a metal and a semiconductor is covered with part of the insulating film 116 during impurity implantation into the first impurity region 107. Consequently, scattering of the metal atoms attributed to the compound layer 115 composed of a metal and a semiconductor and thereby caused diffusion of metal atoms into the semiconductor substrate in the pixel region A are reduced or prevented. Further, an impurity layer is introduced into the compound layer 115 composed of a metal and a semiconductor in the peripheral circuit region B and, thereby, the contact resistance between the compound layer 115 and the contact formed in the contact opening 119b is further reduced.

Figure 4:
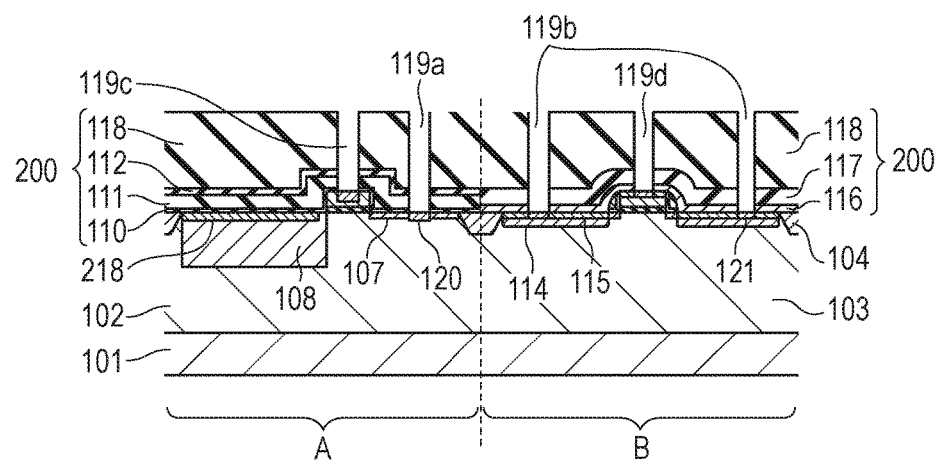
FIG. 4 is a sectional view illustrating the method for manufacturing a solid state image pickup apparatus according to one embodiment.

Subsequently, part of the insulating film 110 (second portion of the insulating layer) and part of the insulating film 116 (first portion of the insulating layer) at the bottoms of the contact opening 119a and the contact opening 119b, respectively, are etched by using a mask (FIG. 4). The insulating films 110 and 116 have the same composition and, therefore, may be etched under the same condition so as to be removed at the same time by once etching step. At this time, part of the insulating film 110 and part of the insulating film 116 at the bottoms of the contact opening 119c and the contact opening 119d, respectively, are also removed by the etching that uses the mask.

After the insulating films 110 and 116 at the bottoms of the contact openings are etched, a conductor is introduced into the contact openings 119a to 119d. Consequently, contact plugs connected to the first impurity region 107, the gate electrodes 106a and 106b, and the compound layer 115 composed of a metal and a semiconductor are formed.

From the viewpoint of preventing diffusion of metal atoms attributed to the compound layer 115 composed of a metal and a semiconductor, the following methods are also considered. In a first method, the contact openings 119b and 119d in the peripheral circuit region B are not formed, only the contact openings 119a and 119c in the pixel region A are formed, and impurity implantation is performed. Thereafter, the contact openings 119b and 119d in the peripheral circuit region B are formed. As the second method, it is considered that the contact openings 119a to 119d are formed at the same time, a mask that covers only the peripheral circuit region B is formed and, thereafter, impurity implantation is performed through the contact openings 119a and 119c.

However, in each of such cases, in order to perform contact formation or impurity implantation, a mask has to be further formed in accordance with a difference between the pixel region A and the peripheral circuit region B. That is, the number of masks required and the number of steps may increase. On the other hand, in the case where the manufacturing method according to the present embodiment is used, the contact resistance between the impurity region and the conductive layer and between the electrode and the conductive layer in the pixel region A are reduced and, in addition, generation of leakage current of the photoelectric conversion unit is suppressed without increasing the number of masks and the number of steps.

In the above-described embodiment, the insulating film 118 is etched by using the insulating films 112 and 117 as the etch stop layers and, thereafter, the insulating film 110 and the insulating film 116 are etched so as to form the contact openings 119a to 119d. However, the peripheral circuit region needs only to have a configuration in which the compound layer composed of a metal and a semiconductor is covered with the insulating film at a bottom of the contact opening when the impurity for the contact is ion-implanted in the pixel region.

Therefore, the insulating layer may be composed of one layer of insulating film and, for example, the contact openings 119a to 119d may be formed by stopping etching before the insulating film is penetrated. Alternatively, for example, the insulating film 118 may be etched such that the insulating films 111 and 117 are exposed at bottoms of the contact openings 119a and 119b, respectively, without forming the insulating films 110 and 116.

Figure 5:
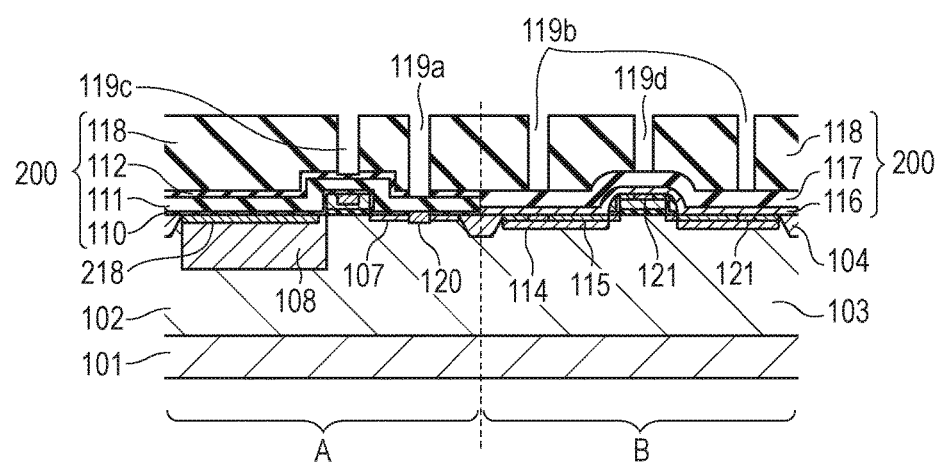
FIG. 5 is a sectional view illustrating the method for manufacturing a solid state image pickup apparatus according to one embodiment.

Alternatively, as shown in FIG. 5, impurity implantation for reducing the contact resistance may be performed in the state in which the insulating films 111 and 117 are not removed by etching. In this case, the first portion of the insulating layer includes the insulating films 116 and 117, and the second portion of the insulating layer includes the insulating films 110 and 111.

The floating diffusion region is shown as the first impurity region 107. However, the present embodiment is not limited to this and, for example, an impurity region that supplies a fixed potential to the semiconductor substrate may be used.
Another Embodiment In the example shown in the above detailed embodiment, only the transistor in the peripheral circuit region B has the side spacer, but the transistor in the pixel region A may have a side spacer. In the present embodiment, differences from the previous embodiment will be described, and explanations of the portions related to the same methods, configurations, materials, compositions, functions, and the like will not be provided.

After the insulating film 112 is formed in FIG. 1B, in the pixel region A, a mask that covers the photoelectric conversion unit 108 and part of the gate electrode 106a on the photoelectric conversion unit 108 side is formed.

The resulting mask is used, and portions, which are not covered with the mask, of the insulating films 110, 111, and 112 on the other part of the gate electrode 106a, on the first impurity region 107, in the peripheral circuit region B, and the like are removed by etching. Consequently, side spacers 213 and 113 are formed on the side surface, on the first impurity region 107 side, of the gate electrode 106a of the transfer transistor and the side surface of the gate electrode of the transistor in the peripheral circuit region B, respectively. For example, dry etching may be used as the etching.

As in the first embodiment, the side spacer 113 is used, and a fifth impurity region 114 serving as the source-drain region of the transistor of the peripheral circuit is formed by subjecting the peripheral circuit region of the semiconductor substrate to self-alignment impurity implantation. An impurity that makes a region implanted with the impurity into an N-type semiconductor region is used as the impurity.

Figure 6A:
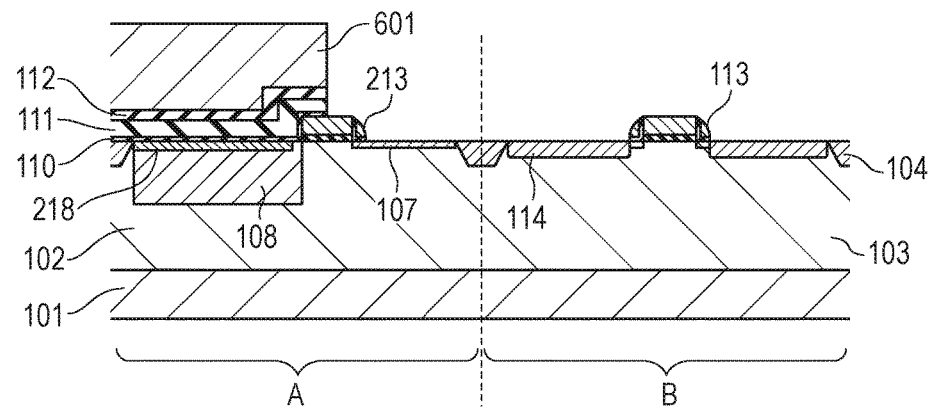
FIGS. 6A to 6C are sectional views illustrating a method for manufacturing a solid state image pickup apparatus according to another embodiment.

Consequently, as shown in FIG. 6A, the source-drain region of the transistor of the peripheral circuit has a structure in which the fifth impurity region 114 and the LDD region are included. In the present embodiment, the fifth impurity region 114 is not formed in the transistor in the pixel region A because a mask 601 is formed in the pixel region A.

Figure 6B:
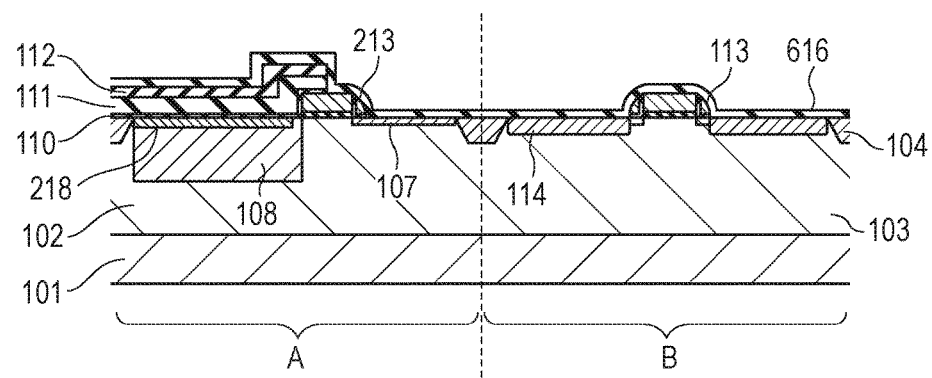

After the fifth impurity region 114 is formed, as shown in FIG. 6B, an insulating film 616, e.g., a silicon oxide film, is formed on the entire surface in the pixel region A and the peripheral circuit region B.

Figure 6C:
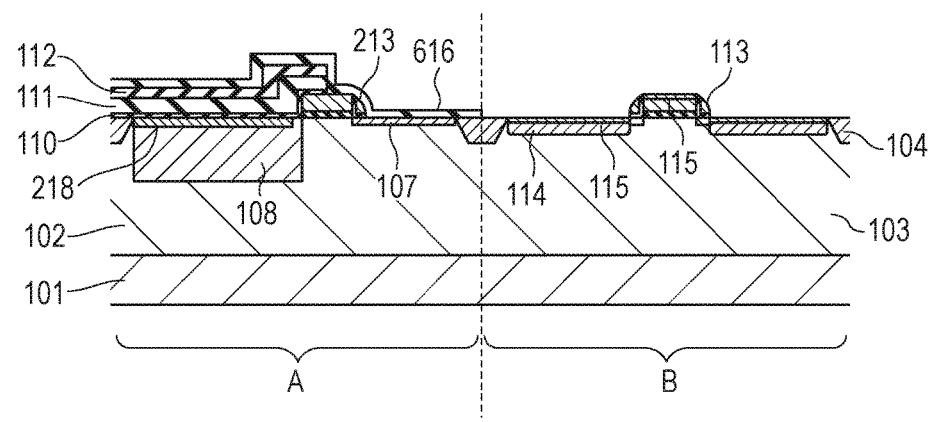

The compound layer 115 composed of a metal and a semiconductor (metal silicide layer) is formed on surface portions of the gate electrode 106b and the fifth impurity region 114 in the peripheral circuit region B by a salicide (self-ALIgned siliCIDE) process (FIG. 6C). The same method as in the first embodiment may be used as the formation method.

Figure 7A:
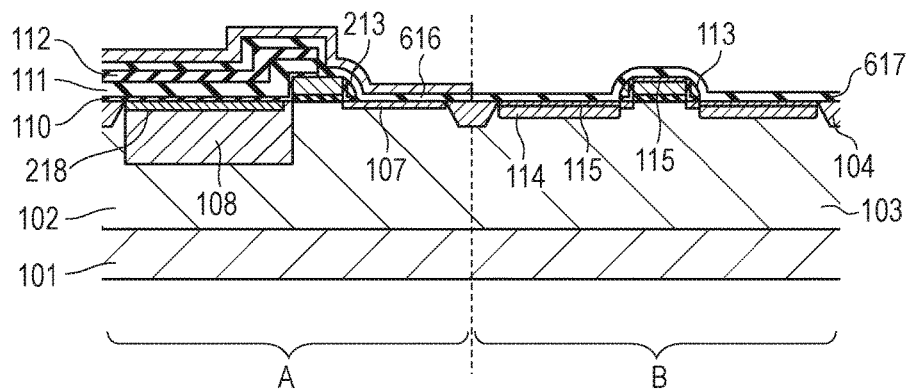
FIGS. 7A to 7C are sectional views illustrating the method for manufacturing a solid state image pickup apparatus according to another embodiment.

As shown in FIG. 7A, after the compound layer 115 composed of a metal and a semiconductor is formed, for example, a silicon nitride film serving as an insulating film 617 is formed on the entire surface in the pixel region A and the peripheral circuit region B by using, for example, a sputtering method or a CVD method. The insulating film 617 is formed on an insulating film 616 in the pixel region A and is formed so as to cover the compound layer 115, the gate electrode 106b, and the side spacer 113 in the peripheral circuit region B.

Figure 7B:
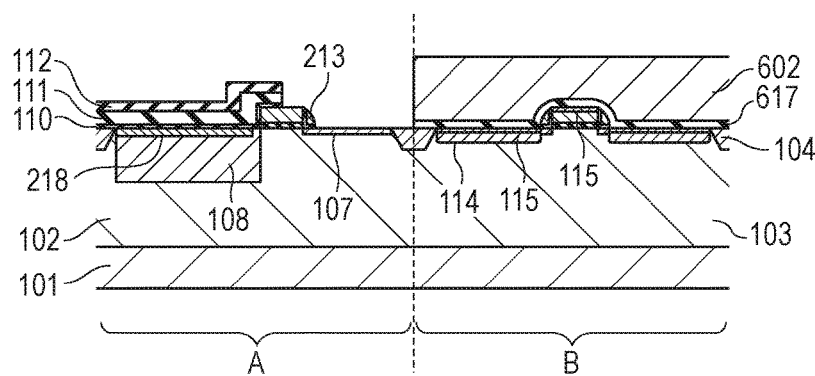

A mask 602 that is a photoresist film that covers the peripheral circuit region B and that exposes the pixel region A is formed. Thereafter, the mask 602 is used and the insulating films 616 and 617 in the pixel region A are removed by etching (FIG. 7B). Subsequently, the mask is removed by aching or the like.

Figure 7C:
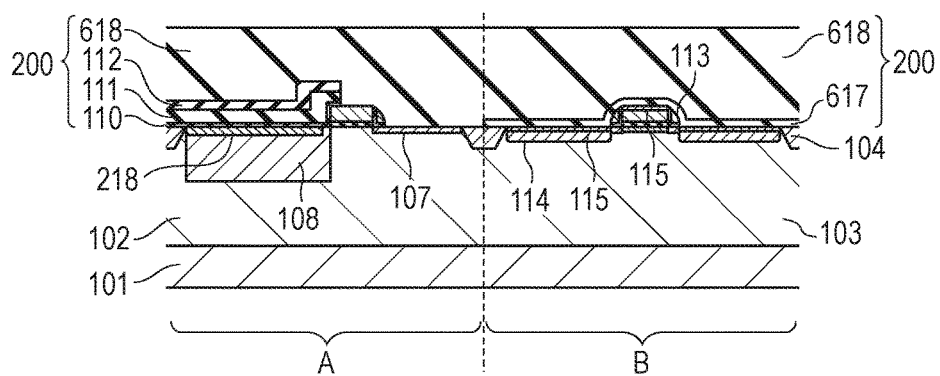

As shown in FIG. 7C, an insulating film 618 is formed on the insulating film 112, the gate electrode 106a, and the first impurity region 107 in the pixel region A and the insulating film 617 in the peripheral circuit region B. For example, an oxide film may be used as the insulating film 618. Specifically, silicon oxide may be used. The insulating films 110, 111, 112, 616, 617, and 618 are collectively referred to as an insulating layer.

In the insulating film 618, the contact openings 119 are formed on the first impurity region 107 and the gate electrode 106a in the pixel region A and over the compound layer 115 in the peripheral circuit region B by photolithography and anisotropic etching.

In the same manner as the first embodiment, the contact opening on the first impurity region 107 is specified as a contact opening 119a, and the contact opening over the compound layer 115 on the fifth impurity region 114 is specified as a contact opening 119b. The contact opening on the gate electrode 106a of the transfer transistor in the pixel region A is specified as a contact opening 119c, and the contact opening over the gate electrode 106b of the transistor in the peripheral circuit region B is specified as a contact opening 119d.

In the present embodiment, both the insulating film 112 and the insulating film 618 are formed by using silicon oxide and, therefore, the insulating film 112 is also etched following the insulating film 618 in the pixel region A during etching of the insulating film 618.

The insulating film 617 functions as an etch stop layer during etching of the insulating films 112 and 618 regarding the contact opening 119b and the contact opening 119d. On the other hand, regarding the contact opening 119a and the contact opening 119c, no insulating film functions as an etch stop layer. Therefore, the openings reach the gate electrode 106*a* and the first impurity region 107.

That is, the upper surface of the gate electrode 106*a* is exposed at a bottom of the contact opening 119*c*, and the first impurity region 107 is exposed at a bottom of the contact opening 119*a*. Meanwhile, the insulating film 617 is exposed at bottoms of the contact opening 119*b* and the contact opening 119*d*.

In this state, N-type impurity ion implantation is performed for the purpose of reducing the contact resistance between a conductor formed in the contact opening and the region connected to the conductor in the same manner as the first embodiment. Specifically, the first impurity region 107, the gate electrode 106*a*, and the compound layer 115 composed of a metal and a semiconductor are subjected to self-alignment contact impurity implantation by using the contact openings 119*a* to 119*d*.

Figure 8:
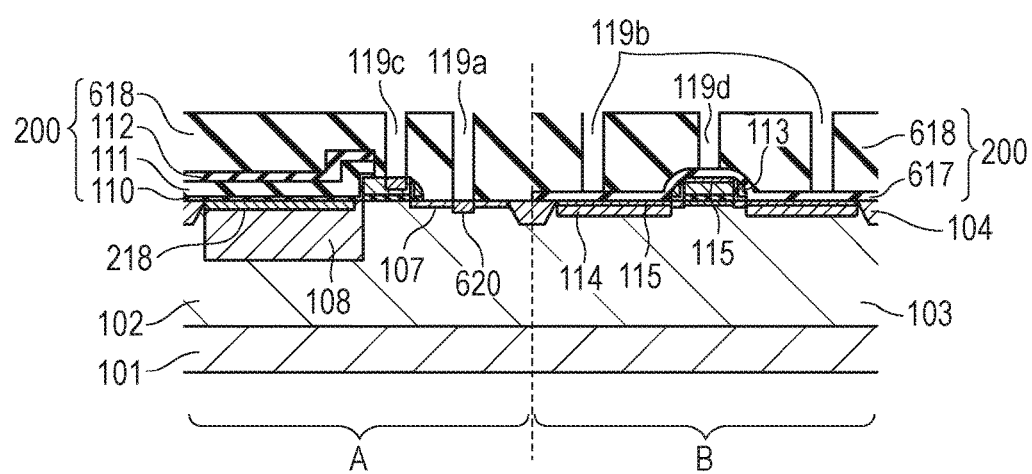
FIG. 8 is a sectional view illustrating the method for manufacturing a solid state image pickup apparatus according to another embodiment.

At this time, as shown in FIG. 8, the impurity is implanted into the first impurity region 107 through the contact opening 119*a* so as to form a high-concentration impurity region 620. Likewise, the impurity is ion-implanted into the gate electrode 106*a* through the contact opening 119*c*. The impurity may also be ion-implanted into the compound layer 115 composed of a metal and a semiconductor through the contact opening 119*b* while part of the insulating film 617 (first portion) is exposed at a bottom of the contact opening 119*b*. Likewise, the impurity may be ion implanted into the gate electrode 106*b* through the contact opening 119*d* and part of the insulating film 617.

In the above-described configuration as well, when the impurity is implanted for the purpose of reducing the contact resistance, the compound layer 115 composed of a metal and a semiconductor is covered with the insulating film 617. Consequently, scattering of the metal element attributed to the compound layer 115 when the impurity is introduced and thereby caused diffusion of the metal element into the semiconductor substrate in the pixel region A are reduced or prevented.

Therefore, generation of leakage current of the photoelectric conversion unit 108 is suppressed and, in addition, the contact resistance in the pixel region A is reduced. Also, speedup of the peripheral circuit is enhanced because the compound composed of a metal and a semiconductor is used for connection between the transistor and the wiring in the peripheral circuit region B.

Yet Another Embodiment

Figure 9:
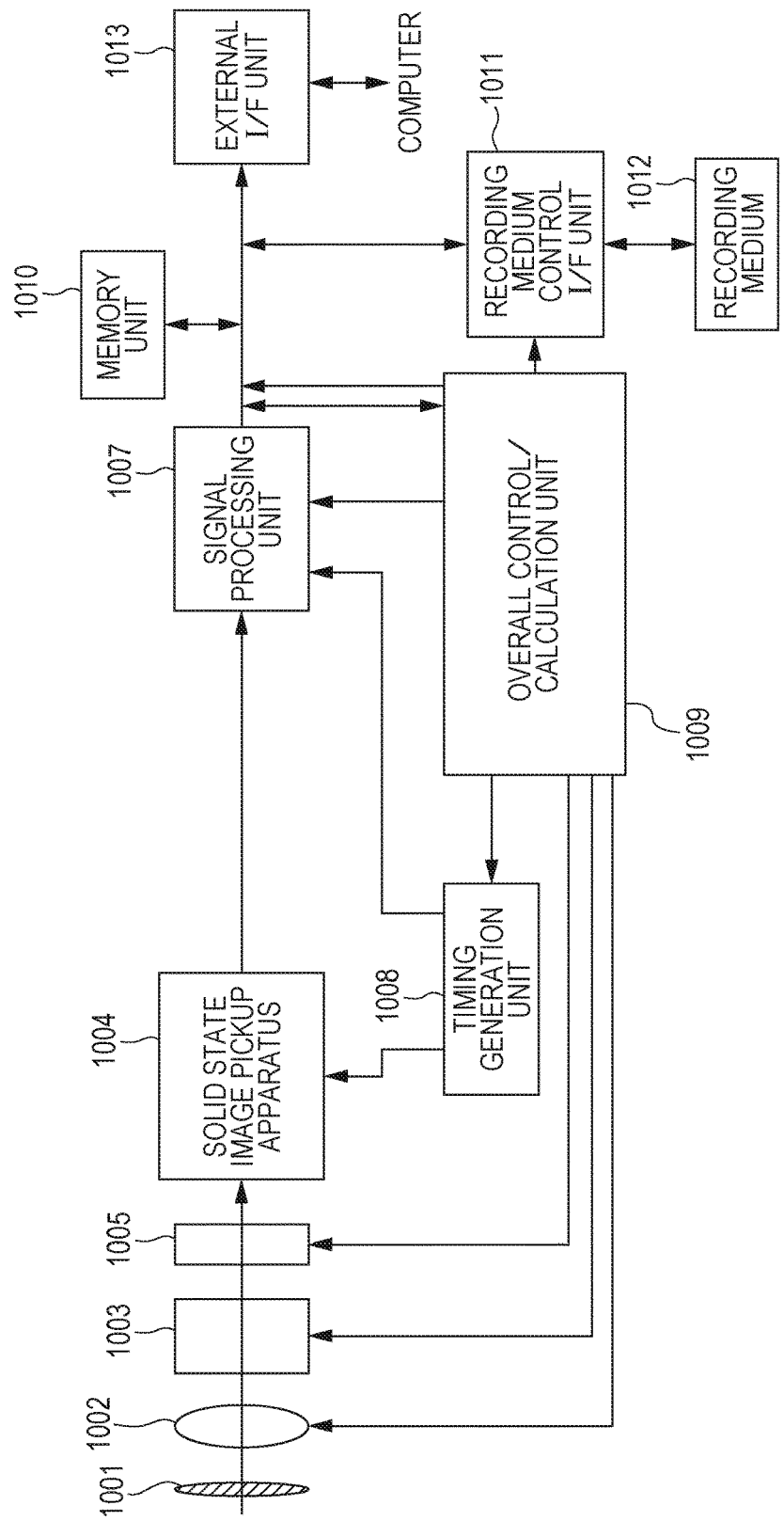
FIG. 9 is a block diagram illustrating an image pickup system according to yet another embodiment.

In the present embodiment, an image pickup system including the solid state image pickup apparatus formed by the manufacturing method explained in the previous embodiments will be described with reference to FIG. 9. Examples of image pickup systems include digital steel cameras, digital camcorders, copiers, facsimile, mobile phones, vehicle-mounted cameras, and observation satellites. FIG. 9 is a block diagram illustrating a digital steel camera as an example of the image pickup system.

In FIG. 9, the image pickup system includes a barrier 1001 that protects a lens, a lens 1002 that focuses an optical image of a photographic subject on a solid state image pickup apparatus 1004, a diaphragm 1003 that changes the amount of light that has passed through the lens 1002, and a mechanical shutter 1005. The image pickup system includes the solid state image pickup apparatus 1004 described in the above-described previous embodiments, and the solid state image pickup apparatus 1004 converts the optical image focused by the lens 1002 into image data. The semiconductor substrate of the solid state image pickup apparatus 1004 includes an AD conversion unit.

The image pickup system further includes a signal processing unit 1007, a timing generation unit 1008, an overall control/calculation unit 1009, a memory unit 1010, a recording medium control I/F unit 1011, a recording medium 1012, and an external I/F unit 1013. The signal processing unit 1007 performs various correction and data compression of imaging data output from the solid state image pickup apparatus 1004. The timing generation unit 1008 outputs various timing signals to the solid state image pickup apparatus 1004 and the signal processing unit 1007.

The overall control/calculation unit 1009 controls the entire digital steel camera, and the memory unit 1010 functions as a frame memory that temporarily stores image data. The recording medium control I/F unit 1011 performs recording on or reading from a recording medium. The recording medium 1012 is composed of a detachably mounted semiconductor memory and the like and performs recording or reading of the imaging data.

The external I/F unit 1013 is an interface that communicates with an external computer and the like. In this regard, the timing signals and the like may be input from the outside of the image pickup system. The image pickup system has to include at least the solid state image pickup apparatus 1004 and the signal processing unit 1007 that processes imaging data output from the solid state image pickup apparatus 1004.

An image pickup apparatus capable of processing high-accuracy imaging data at a high speed is realized by producing the solid state image pickup apparatus 1004 of the image pickup system by using the manufacturing method according to the previous embodiments. Also, the image pickup system having the above-described effects is produced while increases in production steps and cost are suppressed.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-130907 filed Jun. 30, 2016, which is hereby incorporated by reference herein in its entirety.

What is claimed is:

1. A method for manufacturing a solid state image pickup apparatus, comprising the steps of:
    forming, by removing part of an insulating layer by using a first mask:
    a first contact opening on an impurity region; and
    a second contact opening over a compound layer such that a first portion, which covers the compound layer, of the insulating layer is exposed at a bottom of the second contact opening; and
    ion-implanting an impurity into the impurity region through the first contact opening while the first portion that covers the compound layer is exposed at the second contact opening,
    wherein the impurity region is disposed in a pixel region including a photoelectric conversion unit, and
    the compound layer is disposed on at least one of a gate electrode, a drain region, and a source region of a transistor disposed in a peripheral circuit region and is composed of a metal and a semiconductor.

2. The method for manufacturing a solid state image pickup apparatus according to claim 1, wherein the forming of the first contact opening and the second contact opening includes removal of a first part over the impurity region and a second part over the compound layer in the insulating layer by performing etching in which the first mask is used, and
wherein the first portion is arranged between the second part and the compound layer.

3. The method for manufacturing a solid state image pickup apparatus according to claim 2, comprising the step of forming the insulating layer,
wherein the forming of the insulating layer includes
forming a first insulating film that covers the impurity region,
forming, before forming the compound layer, a side spacer that covers the side surface of the gate electrode of the transistor in the peripheral circuit region by etching the first insulating film by using a second mask that covers the first insulating film in the pixel region,
forming, after forming the compound layer, a second insulating film that covers the first insulating film in the pixel region and the transistor in the peripheral circuit region,
etching the second insulating film in the pixel region by using a third mask that covers the second insulating film in the peripheral circuit region, and
forming a third insulating film that covers the first insulating film in the pixel region and the second insulating film in the peripheral circuit region.

4. The method for manufacturing a solid state image pickup apparatus according to claim 1, wherein the first contact opening is formed such that the first contact opening is located over the impurity region with a second portion of the insulating layer interposed therebetween.

5. The method for manufacturing a solid state image pickup apparatus according to claim 4, further comprising the steps of:
removing the first portion and the second portion after the impurity is ion-implanted, and
forming a first contact plug connected to the impurity region and a second contact plug connected to the compound layer by forming conductors in the first contact opening and the second contact opening after the first portion and the second portion have been removed.

6. The method for manufacturing a solid state image pickup apparatus according to claim 4, wherein the film thickness of the first portion is larger than the film thickness of the second portion.

7. The method for manufacturing a solid state image pickup apparatus according to claim 4, comprising the step of forming:
a first insulating film that covers the impurity region,
a second insulating film that covers the compound layer, and
a third insulating film that covers the first insulating film and the second insulating film and that has a composition different from the compositions of the first insulating film and the second insulating film,
wherein the insulating layer includes the first insulating film, the second insulating film and the third insulating film, and
wherein the first insulating film has the second portion, and the second insulating film has the first portion.

8. The method for manufacturing a solid state image pickup apparatus according to claim 7, wherein the forming of the first contact opening and the second contact opening includes etching of the third insulating film by using the first insulating film and the second insulating film as etch stop layers.

9. The method for manufacturing a solid state image pickup apparatus according to claim 1, comprising the step of forming the insulating layer,
wherein the forming of the insulating layer includes
forming a fourth insulating film that covers the impurity region and a first insulating film that has a composition different from the composition of the fourth insulating film and that is disposed on the fourth insulating film,
forming a fifth insulating film that covers the compound layer and that has the same composition as the composition of the fourth insulating film and a second insulating film that has the same composition as the composition of the first insulating film and that is disposed on the fifth insulating film,
forming a third insulating film that covers the fourth insulating film and the fifth insulating film and that has a composition different from the composition of the first insulating film and the second insulating film, and
the forming of the first contact opening and the second contact opening includes:
etching the third insulating film by using the first mask, and
etching the first insulating film and the second insulating film by using the first mask.

10. The method for manufacturing a solid state image pickup apparatus according to claim 9, wherein in the etching of the third insulating film, the third insulating film is etched while the first insulating film and the second insulating film serve as etch stop layers.

11. The method for manufacturing a solid state image pickup apparatus according to claim 9, wherein in the etching of the first insulating film and the second insulating film, the first insulating film and the second insulating film are etched while the fourth insulating film and the fifth insulating film serve as etch stop layers.

12. The method for manufacturing a solid state image pickup apparatus according to claim 1,
wherein in the forming of the first contact opening and the second contact opening, a third contact opening is formed over a gate electrode of a transfer transistor, which controls transfer of the charge generated in the photoelectric conversion unit to the impurity region, such that a third portion of the insulating layer on the gate electrode of the transfer transistor is exposed at a bottom of the third contact opening in the pixel region,
a fourth contact opening is formed over the compound layer on the gate electrode of the transistor in the peripheral circuit region such that a fourth portion of the insulating layer on the compound layer composed of a metal and a semiconductor on the gate electrode is exposed at a bottom of the fourth contact opening, and
in the ion-implanting of an impurity, the impurity is ion-implanted into the gate electrode of the transfer transistor through the third portion.

13. The method for manufacturing a solid state image pickup apparatus according to claim 1, wherein the first contact opening is formed such that the surface of part of the impurity region is exposed at a bottom of the first contact opening.

14. The method for manufacturing a solid state image pickup apparatus according to claim 13, further comprising the steps of:
removing the first portion of the insulating layer after the impurity has been ion-implanted, and
forming a first contact plug connected to the impurity region and a second contact plug connected to the compound layer by forming conductors in the first contact opening and the second contact opening after the first portion of the insulating layer has been removed.

15. The method for manufacturing a solid state image pickup apparatus according to claim 13, comprising the step of forming:
a first insulating film that covers the impurity region,
a second insulating film that covers the compound layer, and
a third insulating film that covers the first insulating film and the second insulating film and that has a composition different from the composition of the first insulating film and the second insulating film,
wherein the insulating layer includes the first insulating film, the second insulating film and the third insulating film, and
wherein the second insulating film has the first portion.

16. The method for manufacturing a solid state image pickup apparatus according to claim 13, comprising the step of forming the insulating layer,
wherein the forming of the insulating layer includes:
forming a fourth insulating film that covers the impurity region and a first insulating film that has a composition different from the composition of the fourth insulating film and that is disposed on the fourth insulating film,
forming a fifth insulating film that covers the compound layer and that has the same composition as the composition of the fourth insulating film and a second insulating film that has the same composition as the composition of the fifth insulating film and that is disposed on the fifth insulating film,
forming a third insulating film that covers the fourth insulating film and the fifth insulating film and that has a composition different from the composition of the first insulating film and the second insulating film, and
the forming of the first contact opening and the second contact opening includes:
etching the third insulating film by using the first mask,
etching the first insulating film and the second insulating film by using the first mask, and
etching the fourth insulating film and the fifth insulating film such that the impurity region is exposed at the first contact opening and the compound layer is covered with part of the fifth insulating film in the second contact opening.

17. The method for manufacturing a solid state image pickup apparatus according to claim 13,
wherein in the forming of the first contact opening and the second contact opening, a third contact opening is formed over a gate electrode of a transfer transistor, which controls transfer of the charge generated in the photoelectric conversion unit to the impurity region, with part of the insulating layer interposed therebetween in the pixel region, and a fourth contact opening is formed over the gate electrode of the transistor with part of the insulating layer interposed therebetween in the peripheral circuit region, and
in the ion-implanting of the impurity, the impurity is ion-implanted into the gate electrode of the transfer transistor through part of the insulating layer.

18. The method for manufacturing a solid state image pickup apparatus according to claim 13, comprising the step of forming the insulating layer,
wherein the forming of the insulating layer includes:
forming a first insulating film that covers the impurity region and the compound layer,
forming a side spacer that covers the side surface of the gate electrode of the transistor in the peripheral circuit region by etching the first insulating film in the pixel region and the first insulating film in the peripheral circuit region by using a second mask,
forming a second insulating film that covers the transistor in the pixel region and the transistor in the peripheral circuit region,
etching the second insulating film by using a third mask such that the first portion is left, and
forming a third insulating film that covers the transistor in the pixel region and the transistor and the first portion in the peripheral circuit region.

19. The method for manufacturing a solid state image pickup apparatus according to claim 18, wherein in the etching of the second insulating film by using the second mask, a side spacer that covers the side surface of the gate electrode of the transistor in the pixel region is formed.

20. The method for manufacturing a solid state image pickup apparatus according to claim 18, wherein the forming of the first contact opening and the second contact opening includes etching of the third insulating film by using the second insulating film as an etch stop layer.

21. The method for manufacturing a solid state image pickup apparatus according to claim 1, wherein the compound layer contains any one of silicides of titanium, nickel, cobalt, tungsten, molybdenum, tantalum, chromium, palladium, and platinum and silicides of alloys of these metals.

* * * * *